(12) United States Patent
Liu et al.

(10) Patent No.: US 11,605,743 B2
(45) Date of Patent: Mar. 14, 2023

(54) PHOTODETECTOR BASED ON PTSE2 AND SILICON NANOPILLAR ARRAY AND PREPARATION METHOD THEREOF

(71) Applicant: Xi'an Technological University, Shaanxi (CN)

(72) Inventors: Huan Liu, Shaanxi (CN); Yuxuan Du, Shaanxi (CN); Jinmei Jia, Shaanxi (CN); Jijie Zhao, Shaanxi (CN); Shuai Wen, Shaanxi (CN); Minyu Bai, Shaanxi (CN); Fei Xie, Shaanxi (CN); Wanpeng Xie, Shaanxi (CN); Mei Yang, Shaanxi (CN); Jiayuan Wu, Shaanxi (CN); Weiguo Liu, Shaanxi (CN)

(73) Assignee: Xi'an Technological University, Shaanxi (CN)

( * ) Notice: Subject to any disclaimer, the term of this patent is extended or adjusted under 35 U.S.C. 154(b) by 0 days.

(21) Appl. No.: 17/505,656

(22) Filed: Oct. 20, 2021

(65) Prior Publication Data

US 2022/0052212 A1 Feb. 17, 2022

(30) Foreign Application Priority Data

Jan. 18, 2021 (CN) .......................... 202110062494.6

(51) Int. Cl.
*H01L 31/0224* (2006.01)
*H01L 31/18* (2006.01)
(Continued)

(52) U.S. Cl.
CPC ...... *H01L 31/022466* (2013.01); *C23C 14/35* (2013.01); *C23C 16/305* (2013.01);
(Continued)

(58) Field of Classification Search
CPC ......... H01L 31/022466; H01L 31/1864; H01L 31/1888; H01L 31/032; H01L 31/035227;
(Continued)

(56) References Cited

U.S. PATENT DOCUMENTS

| 8,835,905 | B2* | 9/2014 | Wober | H01L 27/14643 |
| | | | | 257/52 |
| 9,337,220 | B2* | 5/2016 | Yu | H01L 27/14629 |
| 2015/0364267 | A1* | 12/2015 | Maboudian | H01G 11/36 |
| | | | | 427/79 |

FOREIGN PATENT DOCUMENTS

| CN | 105449016 A | * | 3/2016 | |
| CN | 110611005 A | * | 12/2019 | ......... H01L 31/0336 |
| CN | 111048621 A | * | 4/2020 | ......... H01L 31/0336 |

OTHER PUBLICATIONS

Kim, J. et al., Graphene/Si-nanowire heterostructure molecular sensors, Sci. Rep. 4, 5384; DOI:10.1038/srep05384 (2014). (Year: 2014).*

(Continued)

*Primary Examiner* — Earl N Taylor (57) ABSTRACT

A photodetector based on $PtSe_2$ and a silicon nanopillar array includes a PMMA light-transmitting protective layer, a graphene transparent top electrode, a silicon nanopillar array structure coated with few-layer $PtSe_2$, and metal electrodes of the graphene transparent top electrode and the silicon nanopillar array structure. A method for preparing the photodetector includes steps of: preparing graphene with a CVD method; preparing a silicon nanopillar array structure through dry etching; coating few-layer $PtSe_2$ on surfaces of the silicon nano-pillar array structure through laser interference enhanced induction CVD; preparing graphene transparent top electrode; and magnetron-sputtering metal electrodes. The photodetector prepared by the present invention has a detection range from visible light to near-infrared (Continued)

wavebands. The silicon nanopillar array structure enhances light absorption of the detector, so that the detector has high sensitivity, simple structure and strong practicability.

10 Claims, 4 Drawing Sheets

(51) Int. Cl.
*H01L 31/0352* (2006.01)
*H01L 31/109* (2006.01)
*C23C 16/30* (2006.01)
*C23C 14/35* (2006.01)

(52) U.S. Cl.
CPC .... *H01L 31/035227* (2013.01); *H01L 31/109* (2013.01); *H01L 31/1864* (2013.01); *H01L 31/1888* (2013.01)

(58) Field of Classification Search
CPC . H01L 31/036; H01L 31/109; H01L 27/1443; H01L 27/1446; H01L 31/18; C23C 14/35; C23C 16/047; C23C 16/305; C23C 16/4481; C23C 16/483; C23C 16/045; Y02P 70/50; B82Y 15/00; B82Y 40/00
See application file for complete search history.

(56) References Cited

OTHER PUBLICATIONS

Zeng et al., Ultrafast and sensitive photodetector based on a PtSe2/silicon nanowire array heterojunction with a multiband spectral response from 200 to 1550 nm, NPG Asia Materials 10: 352-362 DOI 10.1038/s41427-018-0035-4 (2018) (Year: 2018).*

Zhang et al., Nanowires for High-Efficiency, Low-Cost Solar Photovoltaics, Crystals (2019), 9, 87; doi:10.3390/cryst9020087, pp. 1-25 (Year: 2019).*

Wu et al., Highly sensitive solar-blind deep ultraviolet photodetector based on graphene/PtSe2/β-Ga2O3 2D/3D Schottky junction with ultrafast speed, Nano Research, (2021), 14(6): 1973-1979 (Year: 2021).*

* cited by examiner

PHOTODETECTOR BASED ON PTSE2 AND SILICON NANOPILLAR ARRAY AND PREPARATION METHOD THEREOF

CROSS REFERENCE OF RELATED APPLICATION

The present invention claims priority under 35 U.S.C. 119(a-d) to CN 202110062494.6, filed Jan. 18, 2021.

BACKGROUND OF THE PRESENT INVENTION

Field of Invention

The present invention relates to optoelectronic technology, and more particularly to a photodetector based on $PtSe_2$ and a silicon nanopillar array as well as a preparation method thereof.

Description of Related Arts

The photodetector converts the energy of optical radiation into electricity through physical effects such as photovoltaic effect and photothermal effect, so as to detect the optical radiation. Photodetectors are widely used in various fields of military and national economy. Within the visible or near-infrared band, the photodetector is mainly used for ray measurement and detection, industrial automatic control, photometric measurement, etc. Within the infrared band, it is mainly used for missile guidance, infrared thermal imaging, infrared remote sensing, etc. Before the discovery of graphene, traditional semiconductors (such as Si, GaN, InGaAs, InSb, HgCdTe, etc.) were the main choices in the photodetector market. Since the discovery of graphene in 2004, a variety of two-dimensional materials have been continuously discovered. Among them, two-dimensional transition metal chalcogenides have attracted many researchers due to their unique structures and properties. Most two-dimensional transition metal chalcogenides such as $MoS_2$, $ReSe_2$ and $WS_2$ have characteristics such as adjustable band gap, strong light-matter interaction, light absorption enhancement, excellent mechanical flexibility, adjustable carrier density, and adjustable polarity. In the huge family of two-dimensional transition metal chalcogenides, $PtSe_2$ not only has the above-mentioned excellent properties, but also has an electron mobility up to 4000 $cm^2V^{-1}S^{-1}$ and a relatively small single-layer band gap of 1.2 eV. This material is very suitable for photodetectors with a wide spectrum from visible light to near-infrared.

However, most photodetectors based on two-dimensional materials still have restrictions in practical applications. This is because the thickness of a single layer or a few layers of the two-dimensional materials is only a few nanometers, making absorption rate of incident light less than 10%. Furthermore, planar semiconductors such as silicon have strong light reflectivity, leading to a relatively low responsivity of the photodetectors formed by two-dimensional materials and planar silicon or other semiconductor planes. For example, Chinese patent application CN109449242A disclosed a heterojunction near-infrared photodetector formed by two-dimensional platinum diselenide nano film and cadmium telluride crystal as well as a preparation method thereof; and Chinese patent application CN109411562A disclosed a heterojunction near-infrared photodetector formed by platinum diselenide film/n-type germanium as well as a preparation method thereof. The photodetectors in the above applicants both adopt a heterojunction formed by vertically stacking two-dimensional film materials and planar germanium or cadmium telluride. Obviously, the photoelectric conversion efficiency of such heterojunction is greatly restricted. In order to solve this problem, silver-assisted chemical etching technology, molecular beam epitaxy and other means are usually used to form nanowire arrays on the surface of the semiconductors such as silicon. For example, Chinese patent application CN110690312A disclosed a non-destructive transfer process of GaN nanopillar arrays grown on a graphene substrate to obtain a flexible ultraviolet detector and a method thereof, and Chinese patent application CN110246913A disclosed an InGaN nanopillar array GSG-type tunable photodetector and a preparation method thereof. The semiconductor nano-array structure in the above applicants are all grown on a graphene substrate by a PA-MBE molecular beam growth method to obtain a semiconductor nano-array structure with a diameter of 60 to 80 nm, In such process, the graphene needs to be transferred multiple times, and finally the transfer carrier PMMA needs to be removed. Moreover, the semiconductor nano-array structure with a diameter of 60 to 80 nm obtained by molecular beam epitaxy is not only expensive, but also has a small end surface area of the nanopillars. If the height and end flatness of the nanopillars cannot be strictly controlled, the contact quality of InGaN and graphene cannot be guaranteed when covering the top of the InGaN nanopillar array with graphene. Chinese patent CN104638049B disclosed a P-type graphene/N-type germanium nanocone array Schottky junction infrared photodetector and a preparation method thereof, wherein through a gas-liquid interface self-assembly method, a polystyrene microsphere film with a hexagonal close-packed structure is laid on a top surface of an N-type germanium substrate as a template for growing the N-type germanium nanocone array, and then oxygen is used as the etching gas to etch the N-type germanium substrate having the polystyrene microsphere film with a reactive ion etching machine; then an electron beam coating process is used to plate the silver film on the top surface of the N-type germanium substrate before heating to remove polystyrene microspheres; and finally the N-type germanium substrate without the polystyrene microspheres is immersed in an etching solution composed of HF, $H_2O_2$ and deionized water for etching, so as to obtain the N-type germanium nanocone array. Although these microstructures have a good light trapping effect and can significantly improve light absorption of the photodetector, the nanowire array and the nanocone array are mainly in tip contact with the graphene mainly, which cause a small effective area of the heterojunction, and bring a greater contact resistance to the device. Therefore, the photoelectric conversion efficiency is also restricted. Moreover, the two-dimensional material layers of most conventional photodetectors have to undergo multiple transfers when combined with other traditional semiconductors such as silicon, germanium and gallium arsenide, and the transfer carrier such as PMMA needs to be removed. In addition, almost all of the similar photodetectors need to prepare metal electrodes on the two-dimensional material layer and other semiconductor surfaces, which means at least two steps are required to complete the electrode preparation, which will inevitably cause a certain degree of damage and pollution to the graphene, resulting in defects in the final contact surface between the two-dimensional material and the semiconductor as well as performance decrease of the final product.

In summary, the commonly used preparation process of the photodetectors based on the two-dimensional material requires a large number of material transfers, and the electrodes require at least two steps to be prepared. As a result, the cost is increased, and cleanliness of the contact surface between the graphene and the semiconductor is decreased, which causes more defects and makes it difficult to form high-quality PN junctions. The photodetector with vertically stacked semiconductor and two-dimensional material has a low light responsivity, and the photoelectric conversion efficiency is greatly limited. Although the detector having the nanowire array or the nanocone array light trapping structure has a high light absorption rate, the small heterojunction contact area will also reduce the photoelectric conversion efficiency.

SUMMARY OF THE PRESENT INVENTION

An object of the present invention is to overcome the above-mentioned defects of the prior art. Therefore, the present invention provides a photodetector based on $PtSe_2$ and a silicon nanopillar array and a preparation method thereof. The structure is simple, safe and eco-friendly, and has high light absorption, responsivity, and photoelectric conversion efficiency.

Accordingly, in order to accomplish the above objects, the present invention provides:

a photodetector based on $PtSe_2$ and a silicon nanopillar array, comprising: a polymethyl methacrylate PMMA light-transmitting protective layer, a graphene transparent top electrode, and a silicon nanopillar array structure covered with few-layer $PtSe_2$, which are arranged in sequence from top to bottom; wherein metal electrodes are provided on a back side of the silicon nanopillar array structure as well as on a periphery of an area uncovered by the silicon nanopillar array structure covered with the few-layer $PtSe_2$ on a back side of the graphene transparent top electrode; the polymethyl methacrylate PMMA light-transmitting protective layer is spin-coated on a front side of the graphene transparent top electrode; the back side of the graphene transparent top electrode is in direct contact with the few-layer $PtSe_2$ to collect photo-generated carriers; the silicon nanopillar array structure consists of an upper part and a lower part; the upper part is a periodically arranged dense silicon nanopillar array structure, and the lower part is an unetched silicon substrate; the silicon nanopillar array structure is perpendicular to the silicon substrate.

A surface of the silicon nanopillar array structure is completely covered by the few-layer $PtSe_2$ through laser interference enhanced induction vapor deposition, wherein top ends and sidewalls of silicon nanopillars are all covered by the few-layer $PtSe_2$ with uniform thicknesses.

The graphene transparent top electrode is combined with the few-layer $PtSe_2$ through a van der Waals force to form an ohmic contact; the $PtSe_2$ is a P-type semiconductor, and after the $PtSe_2$ contacts with N-type silicon, due to a concentration difference between electrons and holes, carriers diffuse and form a space charge depletion zone at an interface, which generates a built-in electric field; a diffusing direction of the carriers is opposite to a drift direction generated by the built-in electric field, and concentrations finally reach a thermal equilibrium; the photo-generated carriers are then separated by the built-in electric field, and are led to an external circuit by the graphene transparent top electrode and the metal electrodes on the back side thereof, as well as by the silicon nanopillar array structure and the metal electrodes on the back side thereof, so as to generate electrical signals.

The photodetector adopts a forward incident mode; an incident direction of an incident light is from the polymethyl methacrylate PMMA light-transmitting protective layer, through the graphene transparent top electrode, and then to the silicon nanopillar array structure coated with the few-layer $PtSe_2$.

Preferably, a thickness of the polymethyl methacrylate PMMA light-transmitting protective layer is 150 nm to 450 nm.

Preferably, the graphene transparent top electrode has 1 to 3 layers, and a thickness is 0.4 nm to 1.5 nm.

Preferably, the few-layer $PtSe_2$ has 3 to 6 layers, and a thickness is 3 nm to 5 nm.

Preferably, a diameter of the nanopillars in the silicon nanopillar array is 500 to 1000 nm, and a length is 3 to 5 μm.

Preferably, thicknesses of the metal electrodes on the back side of the graphene transparent top electrode and the metal electrodes on the back side of the silicon nanopillar array structure are both 150 to 200 nm.

The present invention is based on the photoelectric effect of the PN heterojunction. Conducting of the few-layer $PtSe_2$ is mainly caused by positively charged holes, and the $PtSe_2$ is a P-type semiconductor. After the $PtSe_2$ contacts with heavily doped N-type silicon, there will be a concentration difference at the interface of electrons and holes. Due to different work functions of the two materials, the electrons in the N-type silicon will flow to the few-layer $PtSe_2$, and the holes of the few-layer $PtSe_2$ will flow to the N-type silicon, and concentrations of the two carriers will finally reach a thermal equilibrium. At this time, an energy band on the surface of the N-type silicon will bend upwards, and an energy band on the surface of the few-layer $PtSe_2$ will bend downwards, in such a manner that a space charge zone, also called built-in electric field, is formed near the interface of the two semiconductors. When irradiated with light of certain intensity and wavelength, photo-generated carrier electron-hole pairs will be generated, which are separated by the built-in electric field and enter the external circuit to generate electrical signals, thereby realizing the detection of optical radiation.

A method for preparing the photodetector is provided, comprising steps of:

1) preparing graphene as a graphene transparent top electrode;

2) preparing a silicon nanopillar array structure;

3) coating few-layer $PtSe_2$ on a surface of the silicon nanopillar array structure;

4) spin-coating PMMA on a front side of the graphene transparent top electrode to form a polymethyl methacrylate PMMA light-transmitting protective layer, and transferring to the silicon nanopillar array structure covered with the few-layer $PtSe_2$; and 5) preparing metal electrodes on a back side of the graphene transparent top electrode as well as on a back side of the silicon nanopillar array structure.

In the step 1), the graphene is prepared on a surface of a copper foil through chemical vapor deposition; ethanol and methane are used as raw materials; the prepared graphene has 1-3 layers; in the step 2), a periodically arranged monocrystalline silicon pillar array structure is obtained through photolithography and dry etching processing.

In the step 3), Pt-containing compounds and Se are heated to evaporate, and are transported to the surface of the silicon nanopillar array structure in a reaction chamber by an inert gas mixed with a preset ratio of hydrogen; through laser interference enhanced induction vapor deposition, the Pt-containing compounds, Se and hydrogen are induced by laser irradiation to undergo a chemical reaction; generated PtSe$_2$ is deposited on the surface of the silicon nanopillar array structure to form a few-layer PtSe$_2$ film.

When depositing the few-layer PtSe$_2$, a laser beam is divided into multiple coherent beams through regular-quadrilateral distributed apertures, which forms a regular-quadrilateral distributed interference light field in an area where the silicon nanopillar array structure is located; an optical path difference is adjustable by changing a diameter of the apertures, a hole spacing of the apertures, and a distance between the apertures and the silicon nanopillar array structure, so that interference enhancement points of a coherent pattern on the silicon nanopillar array structure are located on silicon nanopillars, and interference cancellation points are located at gaps between the silicon nanopillars.

In the step 4), a wet transfer technology is adopted to transfer the graphene transparent top electrode to the silicon nanopillar array structure which is coated with the few-layer PtSe$_2$ without removing the PMMA.

In the step 5), the prepared photodetector is processed with one-step magnetron sputtering to obtain the metal electrodes on the back side of the graphene transparent top electrode as well as on the back side of the silicon nanopillar array structure; the silicon nanopillar array structure covered with the few-layer PtSe$_2$ occupies most area in a middle of the graphene transparent top electrode and acts as a mask; during metal electrode sputtering, the electrodes are deposited on the back side of the silicon nanopillar array structure as well as on a periphery of an area uncovered by the silicon nanopillar array structure on the graphene transparent top electrode, thereby forming two metal electrodes synchronically through the one-step magnetron sputtering.

Compared with the prior art, the present invention has the following advantages and beneficial effects:

(1) Compared with conventional photodetectors with light trapping structures such as nanowire arrays and nanocone arrays, the essential difference and advantage of the photodetector of the present invention, which is based on the PtSe$_2$ and the silicon nanopillar array, are that: according to the heterojunction structure of the present invention, the silicon nanopillars are completely covers with the few-layer PtSe$_2$, instead of just contacting a top of a film two-dimensional material to a top of a semiconductor nano-array structure. Such design greatly increases the photosensitive area while taking full advantage of the light trapping effect of the silicon nanopillar array structure. Obviously, when the incident light has been reflected multiple times in the silicon nanopillar array structure, since the sidewalls of the silicon pillars are also coated with the few-layer PtSe$_2$, a photoelectric response will also be generated, which will significantly improve responsivity of the detector.

(2) The silicon nanopillars of the photodetector based on the PtSe$_2$ and the silicon nanopillar arrays of the present invention are formed by photolithography, which provides high surface flatness and smoothness, so as to ensure that interface quality of the heterojunction formed by the few-layer PtSe$_2$ deposited on the surface of the silicon nanopillars. It has the same light trapping ability as the nanowire array and the nanocone arrays, while it has a larger end surface area with extremely high flatness. As a result, its contact area with the graphene transparent top electrode will be increased by at least 70%. Such a significantly increased effective contact area will greatly reduce the contact resistance of the device and effectively improve the photoelectric conversion efficiency of the detector, and thus obtain a higher responsivity.

(3) According to the photodetector based on the PtSe$_2$ and the silicon nanopillar array, silicon is in contact with the few-layer PtSe$_2$ to form a PN heterojunction. The built-in electric field formed by the depletion layer in the junction zone enables the detector to work in a photovoltaic mode when there is no external bias voltage, which, as a passive device, has the advantages of easy integration and low power consumption.

(4) According to the present invention, the photodetector based on the PtSe$_2$ and the silicon nanopillar array can realize effective detection within visible light and near-infrared wavebands, which can be applied to visible light communication, industrial automatic control, photometric measurement, infrared imaging, infrared remote sensing, solar illuminance detection, etc., and there will be considerable economic benefits.

(5) According to the present invention, the photodetector based on the PtSe$_2$ and the silicon nanopillar array and the preparation method thereof are provided. The preparation process only needs to transfer the graphene used as the transparent top electrode once, and the PMMA, which is used as a transfer carrier, does not need to be removed with organic solvent such as acetone. On the one hand, the process is greatly simplified; on the other hand, it also reduces the environmental pollution caused by the use of organic solvents. More importantly, it retains the good conductivity of graphene, avoids the influence of solvents and residues on graphene performance, and provides protection for the graphene film. The few-layer PtSe$_2$ film is obtained by the laser interference enhanced induction chemical vapor deposition, which directly forms the heterojunction with the silicon nanopillars without additional transfer steps. There is no complex process such as photolithography when preparing electrodes, since it can be completed by the one-step magnetron sputtering. These optimized and streamlined processes help to minimize the damage and impurities introduced to the graphene during the preparation process. The cleanliness of the interface between the graphene and the few-layer PtSe$_2$ is greatly improved, which provides a high-quality heterojunction, and improves the performance of the detector.

(6) Using the laser interference enhanced induction chemical vapor deposition to deposit the few-layer PtSe$_2$ on the silicon nano-array structure is the most critical and innovative step in the preparation steps of the present invention. The principle is: when a laser beam passes through the regular-quadrilateral distributed apertures, according to the Fresnel principle, a new spherical wave will be formed each time when the laser beam passes through an aperture, so as to obtain multiple coherent laser beams with same frequency and light vector direction. Optical path differences will be generated when these coherent lights meet at different spatial positions. If the optical path difference is an integer multiple of the wavelength, the light intensity will be coherently enhanced; and if the optical path difference is an odd multiple of the half-wavelength, the light intensity will be coherently weakened. Different lattice-like array-distributed interference patterns can be obtained on the nano-array structure by changing the diameter of the apertures, the hole spacing of the apertures, and the distance between the apertures and the silicon nanopillar array structure. The pattern distribution can be adjusted so that the interference enhancement points are located on silicon nanopillars, and the interference cancellation points are located at the gaps between the silicon nanopillars. The Pt-containing gaseous compounds can absorb enough energy at the laser interference enhancement points, wherein Pt is reduced by hydrogen mixed in the transportation gas, and then chemically reacts with selenium. The generated $PtSe_2$ is deposited on the surface of the silicon nano-array structure to form a film, so that the few-layer $PtSe_2$ completely covers the surfaces of the silicon nanopillars including the sidewalls of the silicon nanopillars.

Compared with the prior art such as a graphene/$TiO_2$ nanopillar array Schottky junction ultraviolet photodetector and its preparation method disclosed in the Chinese patent application CN107195725A and a single-layer graphene/zinc oxide nanorod array Schottky junction ultraviolet photodetector and preparation method thereof disclosed in the Chinese patent CN103346799B, the heterojunction in the present invention is formed by the few-layer $PtSe_2$ and the silicon nanopillars, wherein with the laser interference enhanced induction vapor deposition, the few-layer $PtSe_2$ completely covers the silicon nano-pillars, instead of just contacting a top of the graphene to a top of zinc oxide nanorods or $TiO_2$ nano-pillars to form a heterojunction as mentioned above. This is the essential difference between the present invention and the similar techniques. The area of the heterojunction, which is formed by completely covering the silicon nanopillars with the $PtSe_2$, is greatly increased. The sidewalls of the nanopillars also form the heterojunction with the few-layer $PtSe_2$, which truly makes full use of the light trapping effect of the silicon nanopillars, so as to greatly improve the device performance. In addition, thanks to the photodetector structure design of the present invention, there is no need to add an additional insulating layer between the graphene transparent top electrode layer and the silicon nanopillar array structure coated with the few-layer $PtSe_2$, and the silicon nanopillar array can be 100% used for absorption of the incident light. According to Chinese patent CN103346799B, in order to plate the metal electrodes, the zinc oxide nanorod array needs to be covered by a $SiO_2$ insulating layer occupying ¼ to ⅓ of its area. That is to say, with the same areas of the semiconductor nano-array, the present invention can make full use of the semiconductor nano-array to provide a larger effective area, and the effective area will not be blocked by the electrodes or the insulating layers. Relatively, the detector will generate more photo-generated carriers during operating, and will have a higher responsivity to a certain extent.

DETAILED DESCRIPTION OF THE PREFERRED EMBODIMENT

The present invention will be further illustrated below with embodiments and accompanying drawings. However, implementation and protection scope of the present invention are not limited thereto.

Figure 1:
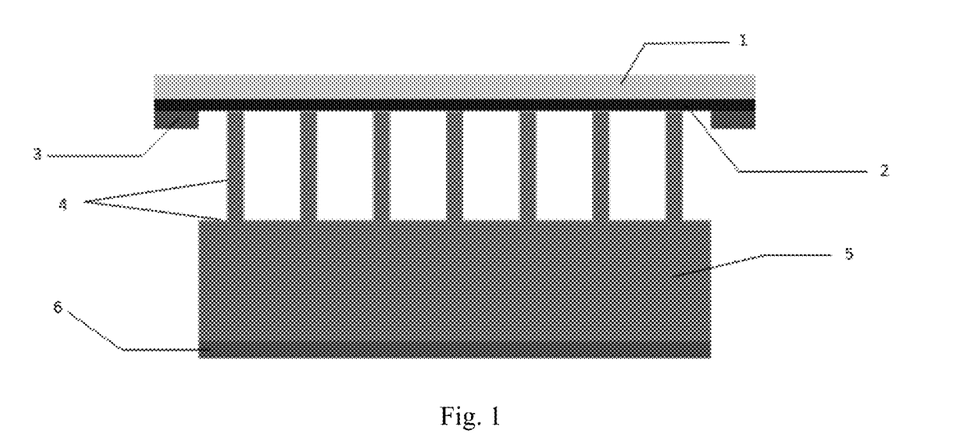
FIG. 1 is a cross-sectional view of a photodetector based on graphene and silicon nanopillar array structure according to the present invention.
Figure 2:
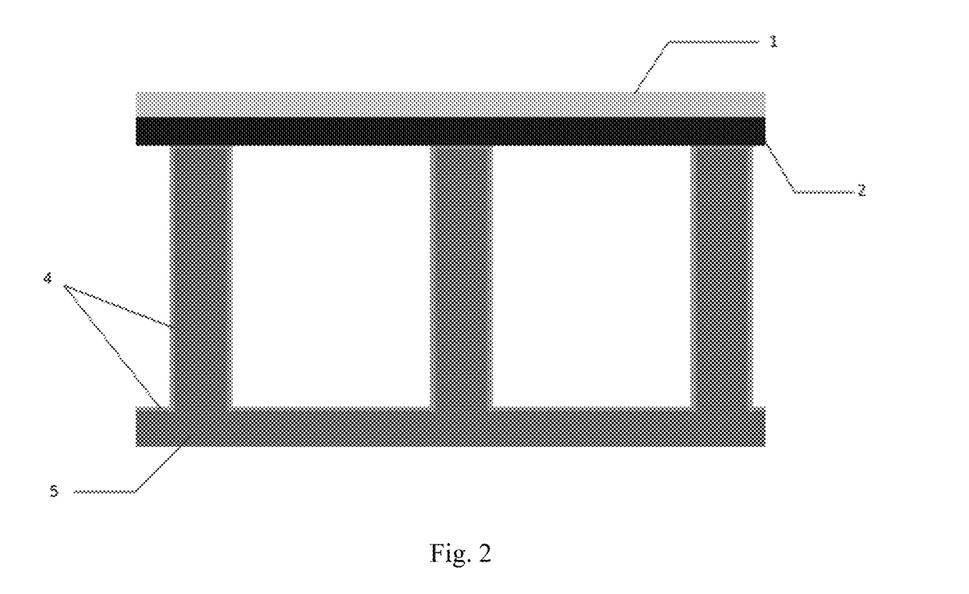
FIG. 2 is a partial-enlarged cross-sectional view of the of the photodetector based on the graphene and the silicon nanopillar array structure according to the present invention.
Figure 3:
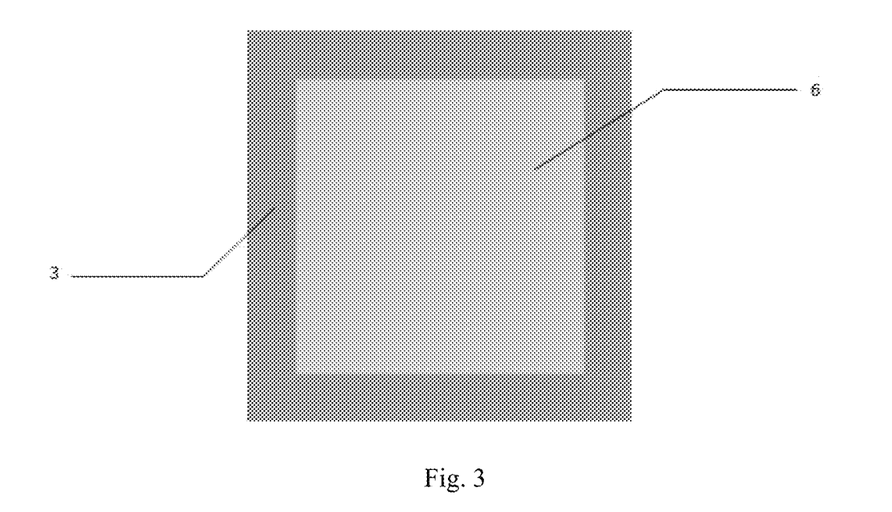
FIG. 3 is a bottom view of an electrode structure of the photodetector according to the present invention.

As shown in FIGS. 1-3, a photodetector based on graphene and silicon nanopillar array structure of the present invention comprises: a polymethyl methacrylate PMMA light-transmitting protective layer 1, a graphene transparent top electrode 2, a metal frame bus electrode 3 on a back side of the graphene transparent top electrode 2, few-layer $PtSe_2$ 4, a silicon nanopillar array structure 5, and Au metal electrodes 6 on a back side of the silicon nanopillar array structure 5, which are arranged in sequence from top to bottom; wherein a thickness of the polymethyl methacrylate PMMA light-transmitting protective layer 1 is 150 nm to 450 nm; the graphene transparent top electrode 2 has 1 to 3 layers, and a thickness is 0.4 nm to 1.5 nm; the few-layer $PtSe_2$ 4 has 3 to 6 layers, and a thickness is 3 nm to 5 nm; a diameter of the nanopillars in the silicon nanopillar array 5 is 500 to 1000 nm, and a length is 3 to 5 μm; thicknesses of the Au metal electrodes 6 on the back side of the graphene transparent top electrode 2 and the Au metal electrodes 6 on the back side of the silicon nanopillar array structure 5 are both 150 to 200 nm. According to the present invention, conducting of the few-layer $PtSe_2$ is mainly caused by positively charged holes, and the $PtSe_2$ is a P-type semiconductor. After the $PtSe_2$ contacts with heavily doped N-type silicon, there will be a concentration difference at the interface of electrons and holes. Fermi level of $PtSe_2$ is about 4.84 eV, and Fermi level of N-type silicon is about 4.25 eV. Therefore, the electrons in the N-type silicon will flow to the few-layer $PtSe_2$, and the holes of the few-layer $PtSe_2$ will flow to the N-type silicon, and concentrations of the two carriers will finally reach a thermal equilibrium. At this time, an energy band on the surface of the N-type silicon will bend upwards, and an energy band on the surface of the few-layer $PtSe_2$ will bend downwards, in such a manner that a space charge zone, also called built-in electric field, is formed near the interface of the two semiconductors. It is detected that a barrier height at the interface between the $PtSe_2$ and the N-type silicon is 0.6 eV, and a theoretical spectral response ranges from visible light to 2066 nm near-infrared. When irradiated with light within such wavelength range, photo-generated carrier electron-hole pairs will be generated, which are separated by the built-in electric field and enter the external circuit to generate electrical signals, thereby realizing the detection of optical radiation.

A method for preparing the photodetector based on the $PtSe_2$ and the silicon nanopillar array according to the embodiment comprises steps of:

(1) cleaning and annealing a copper foil, and then processing single-layer or few-layer graphene on a surface of the processed copper foil with chemical vapor deposition, so as to form a graphene/copper foil;

(2) cleaning an N-type double-sided polished silicon wafer, spin-coating photoresist, and forming a silicon nanopillar array structure pattern through step-wise exposure and development; dry-etching the silicon wafer, and finally removing the residual photoresist for forming a silicon nanopillar array structure;

(3) putting the prepared silicon nano-pillar array structure into a laser interference enhanced induction chemical vapor deposition device; heating and evaporating $PtCl_2$ and Se powder as precursors; transporting into a reaction chamber with an inert gas such as argon which is mixed with a small amount of hydrogen; adjusting laser power, wavelength and aperture positions; wherein the two precursors chemically react on a surface of the silicon nanoarray structure under laser interference enhanced induction to deposit a $PtSe_2$ film on the surface, thereby forming a few-layer $PtSe_2$/nanopillar array structure;

(4) spin-coating the graphene/copper foil by using PMMA, removing the copper foil in a chemical etching solution, and cleaning to obtain a graphene/PMMA film; then transferring to the prepared silicon nanoarray structure coated with the few-layer $PtSe_2$, so as to form a PMMA/graphene/few-layer $PtSe_2$/nanopillar array structure; and (5) processing the prepared PMMA/graphene/nanopillar array structure with one-step magnetron sputtering to simultaneously prepare Au metal electrodes on a back side of the graphene transparent top electrode as well as on a back side of the silicon nanopillar array structure; wherein the silicon nanopillar array structure acts as a mask during sputtering, and finally obtained electrodes cover a periphery of an area uncovered by the silicon nanopillar array structure on the graphene surface as well as the back side of the silicon nanopillar array structure.

Preferably, cleaning and annealing in the step (1) comprise: first cleaning the copper foil with acetone, absolute ethanol, and deionized water to remove surface organic impurities, and then placing the copper foil in an annealing furnace at a temperature of 1000° C. in order to make copper atoms aligned and improve surface activity of copper.

Preferably, the chemical vapor deposition in the step (1) uses an atmospheric or low-pressure chemical vapor deposition system for preparing graphene; Ar gas is used to carry organic carbon sources such as ethanol, and hydrogen is used as a protective gas to reduce oxygen content and prevent the copper foil from oxidization under a high temperature.

Preferably, cleaning the N-type double-sided polished silicon wafer in the step (2) comprises: using sulfuric acid and hydrogen peroxide solution to remove organic pollutants, using ammonia and hydrogen peroxide solution to remove non-metal contamination, using hydrofluoric acid to remove surface oxidation layer of the silicon wafer, and using salt water and hydrogen peroxide to remove metal contamination. A thickness of the photoresist spin-coated on the surface of the silicon wafer is about 2 μm, so as to form the silicon nanopillar array structure pattern through stepwise exposure and development. the silicon wafer is dry-etched, and then acetone and alcohol are used to remove the remaining photoresist before washing with deionized water and drying with nitrogen, so as to obtain the silicon nanopillar array structure.

Preferably, in the step (3), the few-layer $PtSe_2$ film is deposited through laser interference enhanced induction chemical vapor deposition, comprising: putting the nanopillar array structure into the reaction chamber, and putting the precursor $PtCl_2$ and Se into a heating zone with a mass ratio of about 1:8; heating at 450° C. and 220° C., and introducing a mixed gas of hydrogen and argon with a flow rate of 150 sccm, wherein a ratio of argon to hydrogen is about 9:1; after chemical composition of the transport airflow in the reaction chamber is stabilized, adjusting the laser wavelength and the aperture positions to start film deposition, so that the surface of the silicon nanopillar array structure is completely covered with the few-layer $PtSe_2$ film.

Preferably, in step (4), a spin-coating wet transfer method comprises: evenly coating the PMMA on the graphene/copper foil with a homogenizer, wherein a thickness of the PMMA is 150 to 450 nm; then etching the copper foil with pre-prepared ferric chloride ($FeCl_3$) solution or $(NH_4)S_2O_8$ solution; after the copper foil is completely dissolved, cleaning the remaining PMMA/graphene with deionized water to ensure that the remaining ferric chloride is removed; then drying and transferring to the silicon nanopillar array structure coated with the few-layer $PtSe_2$, wherein the PMMA-coated graphene directly contacts with the silicon nanopillars without removing the PMMA.

Preferably, in the step (5), one-step magnetron sputtering method is used to prepare the metal electrodes, wherein a sputtering target is a high-purity gold target, a background vacuum is $2 \times 10^{-3}$ Pa, a shielding gas is Ar, a working pressure is 0.67 Pa, a sputtering power is 100 w, a sputtering period is 30 seconds to 1 minute, and thicknesses of the obtained metal electrodes are all 150 to 200 nm.

A principle of the laser interference enhanced induction chemical vapor deposition of the present invention is that: according to the Fresnel principle, when a laser beam passes through the regular-quadrilateral distributed apertures, a new spherical wave will be formed each time when the laser beam passes through an aperture, and a plurality of spherical waves will be formed through the apertures. Optical path differences will be generated when these coherent lights meet at different spatial positions. If the optical path difference is an integer multiple of the wavelength, the light intensity will be coherently enhanced; and if the optical path difference is an odd multiple of the half-wavelength, the light intensity will be coherently weakened. Lattice-like array-distributed array interference pattern consistent with the silicon nano-array structure can be obtained by changing the diameter of the apertures, the hole spacing of the apertures, and the distance between the apertures and the silicon nanopillar array structure. The pattern distribution can be adjusted so that the interference enhancement points are located on silicon nanopillars, and the interference cancellation points are located at the gaps between the silicon nanopillars. The Pt-containing gaseous compounds, hydrogen and selenium can absorb energy at the laser interference enhancement points, wherein the generated $PtSe_2$ is deposited on the surface of the silicon nano-array structure to form a film.

Embodiment 1

1. Cutting a copper foil (with a thickness of 25 μm and a purity of 99.99%) and immersing into acetone for 5 minutes, then putting in an ultrasonic machine for 10 seconds; removing the acetone and ultrasonically cleaning for 5 minutes with ethanol, and finally washing with deionized water several times and drying surfaces with a nitrogen gun; placing the processed copper foil on a quartz slide and pushing to a position near a thermocouple in a heating zone at a middle of an external end of a quartz tube; after evacuating to about 4 Pa before introducing argon gas to restore normal pressure; repeating the above process to reduce an oxygen content and prevent the copper foil from being oxidized under high temperature conditions; keeping flows of Ar gas (Ar1, 500 mL/min) and $H_2$ (30 mL/min) unchanged in the first channel, program-control for 90 minutes, and heating to 1000° C. at a constant rate; the processing with heat preservation and pre-heat treatment for 2 h, so that arrangement of copper atoms tends to be consistent while surface activity of the copper foil is increased, thereby promoting deposition of carbon atoms; after preheating, bring ethanol (analytical purity, ambient temperature 15° C.) into the quartz tube through the Ar gas (Ar2, 100 mL/min) in the second channel and keeping for a certain period of time, and then cooling to room temperature to complete the preparation of the graphene film and obtain the graphene/copper foil.

2. Preparing $H_2SO_4/H_2O_2$ (1:3), $NH_4OH/H_2O_2/H_2O$ (1:1:5), $HF:H_2O$ (1:5), $HCL/H_2O_2/H_2O$ (1:1:6) solutions respectively, wash an N-type double-sided polished silicon wafer with the above solutions in sequence at cleaning temperatures of 100° C., 70° C., 20° C., and 70° C.; then washing with deionized water for 15 minutes; processing the cleaned silicon wafer with photolithography, which comprises specific steps of: spin-coating (i.e. operating a homogenizer at a low speed of (500 rpm) while adding negative photoresist, then increasing the rotation speed (3000 rpm), spinning to stretch photoresist and volatilizing solvent until a thickness of the photoresist covering surfaces of the silicon wafer is about 2 μm); soft-baking (i.e. heating a vacuum hot plate to 120° C., and baking the silicon wafer coated with the photoresist for 30 seconds); aligning and exposing (i.e. putting a photolithography mask and a sample in a photolithography machine, then aligning before step-wise exposure); post-baking (i.e. after the sample is photoetched, placing on the vacuum hot plate at 110° C. for 60 seconds); developing (i.e. developing the sample with xylene solution, and then cleaning with butyl acetate); and hard-baking (i.e. placing the developed sample on the vacuum hot plate at 120° C. for 60 seconds).

Figure 4:
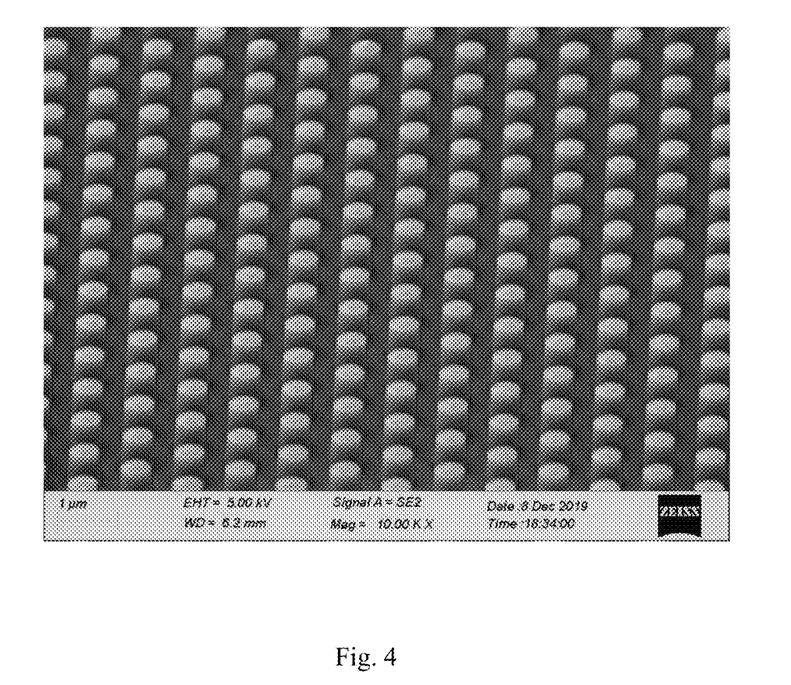
FIG. 4 is a scanning electron microscope cross-sectional view of a silicon nanopillar array structure according to an embodiment 1.

3. Using a ME-3A multifunctional magnetic enhanced reactive ion etching machine to etch the silicon wafer sample with the nanopillar array structure pattern obtained by photolithography, which comprises specific steps of: loading (i.e. enabling cooling water and main power supply, preheating a RF power filament and deflating, opening a cover of the reaction chamber, placing the silicon wafer on a disc-shaped metal bottom electrode, and closing the cover of the reaction chamber tightly); vacuuming (i.e. checking whether a "molecular pump" knob is in a "On" state, if yes, starting a mechanical pump, so that the molecular pump will start automatically after about 30 s, performing subsequent operation after the molecular pump enters a stable working state); selecting an etching method (i.e. selecting a MERIE etching method, and timing for 3 min); venting (i.e. setting a flow rate meter switch to "Valve Control", opening $SF_6$ and $O_2$ intake valves, adjusting gas flow to 36 $cm^3/s$ and 6 $cm^3/s$ respectively, and keeping a working pressure at 275 mtorr); starting etching (i.e. pressing "start", switching plate pressure Ua to ON to start working, adjusting an output power to 120 W, and adjusting a matching device to minimize a reflected power indication Pr); stopping etching and turning off the system (i.e. closing gas paths and pumping out residual gas in the reaction chamber for 1 to 3 minutes, then pressing "Off", deflating after the mechanical pump is stopped, and taking out the sample); removing the remaining photoresist with acetone and alcohol, washing with deionized water and drying with nitrogen. The silicon nanopillar array structure obtained by the above process is shown in FIG. 4, which has uniform size, aligned arrangement, and flat end faces of the silicon pillars.

4. Putting the silicon nanopillar array structure into the reaction chamber of the laser induction chemical vapor deposition system, putting $PtCl_2$ powder and Se powder, which have a mass ratio of 1:8, into different heating zones, and setting temperatures to 500° C. and 250° C. respectively; introducing a mixed gas of hydrogen and argon with a flow rate of 200 sccm, wherein a ratio of argon to hydrogen is 9:1; wherein a laser power is 100 W, and a laser beam wavelength is 1 μm; adjusting the diameter of the apertures, the hole spacing of the apertures, and the distance between the apertures and the silicon nanopillar array structure in the laser interference system, so as to ensure that an interference light field is formed in an area where the silicon nano-array structure is located, wherein interference enhancement positions correspond to the silicon nanopillars and interference cancellation positions correspond to gaps between the silicon nanopillars; depositing after chemical compositions of the air flow in the reaction chamber reaches a stable state, and setting a deposition time to 10 minutes; after the deposition of the few-layer $PtSe_2$ film, turning off laser and gas inlet valve, and taking out the sample after the sample is cooled to room temperature, so as to obtain the few-layer $PtSe_2$/silicon nanopillar array structure.

5. Evenly coating PMMA on the graphene/copper foil with a homogenizer at 500 r/min for 6 s and 2000 r/min for 40 s, wherein a thickness of the PMMA is 150 to 450 nm; then baking on a constant temperature heating platform at 170° C. for 5 minutes (to make the PMMA solution more uniformly cover the copper foil) to obtain a PMMA/graphene/copper foil; polishing the uncoated surfaces with a sandpaper to remove the graphene that hinders the dissolution of the copper; putting the PMMA/graphene/copper foil in 80° C. 1 mol/L $FeCl_3$ solution or $(NH_4)S_2O_8$; after the copper substrate is completely dissolved, using a quartz plate to move the PMMA/graphene into deionized water and distilled water in sequence for cleaning; then moving it to a prepared structure and natural air drying, so as to obtain the PMMA/graphene/small-layer $PtSe_2$/N-type silicon nanopillar array; wherein the graphene directly contacts with the few-layer $PtSe_2$ without removing the PMMA.

6. Putting a gold target and the PMMA/graphene/few-layer $PtSe_2$/N-type silicon nanopillar array into a vacuum chamber of a magnetron sputtering coating machine in sequence, turning on a mechanical pump and vacuuming to below 3 Pa, turning on a molecular pump and vacuuming to below $2\times10^{-3}$ Pa, introducing argon and nitrogen, turning on glow discharge, setting process parameters, wherein a working pressure is 0.67 Pa, protective gas is Ar, a target base distance is 90 mm, a sputtering power is 100 w, and a sputtering time is 30 seconds to 1 minute; opening a vent valve to store normal pressure in the vacuum chamber, then raising a cover plate, and taking out the sample, wherein a thickness of the metal electrodes obtained is 150 to 200 nm; a bottom view of the obtained metal electrode is shown in FIG. 3. So far, the photodetector based on the few-layer $PtSe_2$ and the silicon nanopillar array structure of the present invention has been prepared.

Embodiment 2

1. Cutting a copper foil (with a thickness of 25 μm and a purity of 99.99%) to a desired size, and then ultrasonically cleaning for 15 minutes with acetone and alcohol in sequence; processing with 20% dilute hydrochloric acid for 20 minutes, and finally ultrasonically cleaning in acetone, alcohol and ionized water for 10 minutes and drying surface moisture with a nitrogen gun; placing cleaned and dried copper foil in a constant temperature zone of a tube furnace; filling a sealed quartz tube with Ar gas with a flow rate of 1100 sccm and hydrogen with a flow rate of 20 sccm; heating the tube furnace to 1000° C. at a heating rate of 10° C./min, then setting the hydrogen flow rate to 100 sccm and preheating for 60 min, so that arrangement of copper atoms tended to be consistent while surface activity of the copper foil is increased, thereby promoting deposition of carbon atoms; then introducing $C_2H_4$ at a flow rate of 1 sccm for 60 s, 90 s and 120 s, and then introducing Ar gas and hydrogen until the copper foil is cooled to room temperature; shutting down the tube furnace to complete the preparation of the graphene film and obtain a graphene/copper foil.

2. Taking an N-type double-sided polished silicon wafer, and immersing in $H_2SO_4/H_2O_2$ (1:1) for 15 minutes, water-bathing in $NH_4OH/H_2O_2/H_2O$ (1:1:4) at 75° C. for 4 to 5 minutes, and water-bathing in HCL/H$_2$O$_2$/H$_2$O (1:1:4) at 75° C. for 3 to 4 minutes; after each of the above steps, washing with HF acid buffer solution for 3-5 minutes, and washing with deionized water several times; processing the cleaned silicon wafer with photolithography, which comprises specific steps of: spin-coating (i.e. stopping a homogenizer and adding negative photoresist, then increasing the rotation speed (4000 rpm), spinning to stretch photoresist and volatilizing solvent until a thickness of the photoresist covering surfaces of the silicon wafer is about 2 μm); soft-baking (i.e. heating a vacuum hot plate to 100° C., and baking the silicon wafer coated with the photoresist for 40 seconds); aligning and exposing (i.e. putting a photolithography mask and a sample in a photolithography machine, then aligning before step-wise exposure); post-baking (i.e. after the sample is photoetched, placing on the vacuum hot plate at 130° C. for 30 seconds); developing (i.e. developing the sample with xylene solution, and then cleaning with ethanol and trichloroethylene); and hard-baking (i.e. placing the developed sample on the vacuum hot plate at 100° C. for 120 seconds).

3. Using a British STS multiplex ICP high density reactive ion etching machine to etch the silicon wafer sample with the nanopillar array structure pattern obtained by photolithography, which comprises specific steps of: loading (i.e. opening LoadLock after the vacuum chamber is inflated, applying vacuum grease on a tray, and putting the silicon wafer into the tray with tweezers); vacuuming and selecting a heating mode (i.e. turning on a mechanical pump, setting a heating or cooling temperature, and waiting until temperature and vacuum reach set values); etching (i.e. setting program, wherein process parameters are: in one cycle, a time period for introducing etching gas SF$_6$ is 4 s, a time period for introducing passivation gas C$_4$F$_8$ is 3 s; a coil power is 400 W, a plate power is 110 W, a flow rate of the etching gas SF$_6$ is 13 cm$^3$/min, and a flow rate of the passivation gas C$_4$F$_8$ is 13 cm$^3$/min); taking out the silicon wafer (after etching, turning off the vacuum pump and opening the LoadLock to take out the sample); removing the remaining photoresist and the vacuum grease with acetone and alcohol, washing with deionized water and drying with nitrogen, thereby obtaining the silicon nanopillar array structure.

4. Putting the silicon nanopillar array structure into the reaction chamber of the laser interference enhanced induction chemical vapor deposition system, putting PtCl$_2$ powder and Se powder, which have a mass ratio of 1:10, into different heating zones, and setting temperatures to 450° C. and 220° C. respectively; introducing a mixed gas of hydrogen and argon with a flow rate of 150 sccm, wherein a ratio of argon to hydrogen is 10:1; wherein a laser power is 100 W, and a laser beam wavelength is 1 μm; adjusting the diameter of the apertures, the hole spacing of the apertures, and the distance between the apertures and the silicon nanopillar array structure in the laser interference system, so as to ensure that an interference light field is formed in an area where the silicon nano-array structure is located, wherein interference enhancement positions correspond to the silicon nanopillars and interference cancellation positions correspond to gaps between the silicon nanopillars; depositing after chemical compositions of the air flow in the reaction chamber reaches a stable state, and setting a deposition time to 15 minutes; after the deposition of the few-layer PtSe$_2$ film, turning off laser and gas inlet valve, and taking out the sample after the sample is cooled to room temperature, so as to obtain the few-layer PtSe$_2$/silicon nanopillar array structure.

5. Evenly coating PMMA on the graphene/copper foil with a homogenizer at 600 r/min for 5 s and 4000 r/min for 20 s, wherein a thickness of the PMMA is 150 to 450 nm; then baking on a constant temperature heating platform at 100° C. for 120 s to complete solidifying the PMMA; then separating the graphene from the copper foil through electrochemical separation; preparing 0.05 mmol/L K$_2$S$_2$O$_8$ aqueous solution as electrolyte; using a carbon rod as anode, and PMMA/graphene/copper foil as cathode, wherein a power supply is a 5V DC voltage source; immersing the carbon rods and the PMMA/graphene/copper foil in the electrolyte to be energized, and generating H$_2$ bubbles at an interface between the graphene and the copper foil through electrolyzed water; separating the graphene film from the copper foil to obtain PMMA/graphene; using a quartz plate to move the PMMA/graphene into deionized water and distilled water in sequence for cleaning; then moving it to a prepared silicon nanopillar structure and drying on a 100° C. heating platform, so as to obtain the PMMA/graphene/small-layer PtSe$_2$/N-type silicon nanopillar array; wherein the graphene directly contacts with the few-layer PtSe$_2$ without removing the PMMA.

6. Using magnetron sputtering to plate metal electrodes, which comprises steps of: opening cooling water and vacuum chamber gas inlet valves; turning on a main power supply of the system, raising a vacuum chamber splash plate, and fixing a gold target on a magnetron target base; placing the PMMA/graphene/few-layer PtSe$_2$/silicon nanopillar array structure on a corresponding substrate position, and setting a target base distance to 90 mm; lowering the vacuum chamber splash plate, closing the gas inlet valve, and turning on the mechanical pump; opening a manual angle valve to evacuating the main vacuum chamber with the mechanical pump; observing the thermal vacuum gauge; when a pressure drops below 3 Pa, starting the molecular pump and opening a solenoid valve, closing bypass angle valve, opening a baffle valve, and evacuating with the molecular pump; when the vacuum reaches $2 \times 10^{-3}$ Pa, performing coating; introducing argon and nitrogen and adjusting the flow to 20 sccm; setting a sputtering time to 30 seconds to 1 minute; closing a gate valve appropriately to maintain the working pressure at about 0.67 Pa; turning on a DC power switch and preheating for 5 to 10 minutes; turning on DC The power supply, adjusting a potentiometer, and setting a sputtering power to 100 w to start glow discharge in the vacuum chamber; adjusting flowmeter, gate valve, and power supply to desired process parameters; then opening a vent valve to store normal pressure in the vacuum chamber, then raising a cover plate, and taking out the sample, wherein a thickness of the metal electrodes obtained is 150 to 200 nm.

Figure 5:
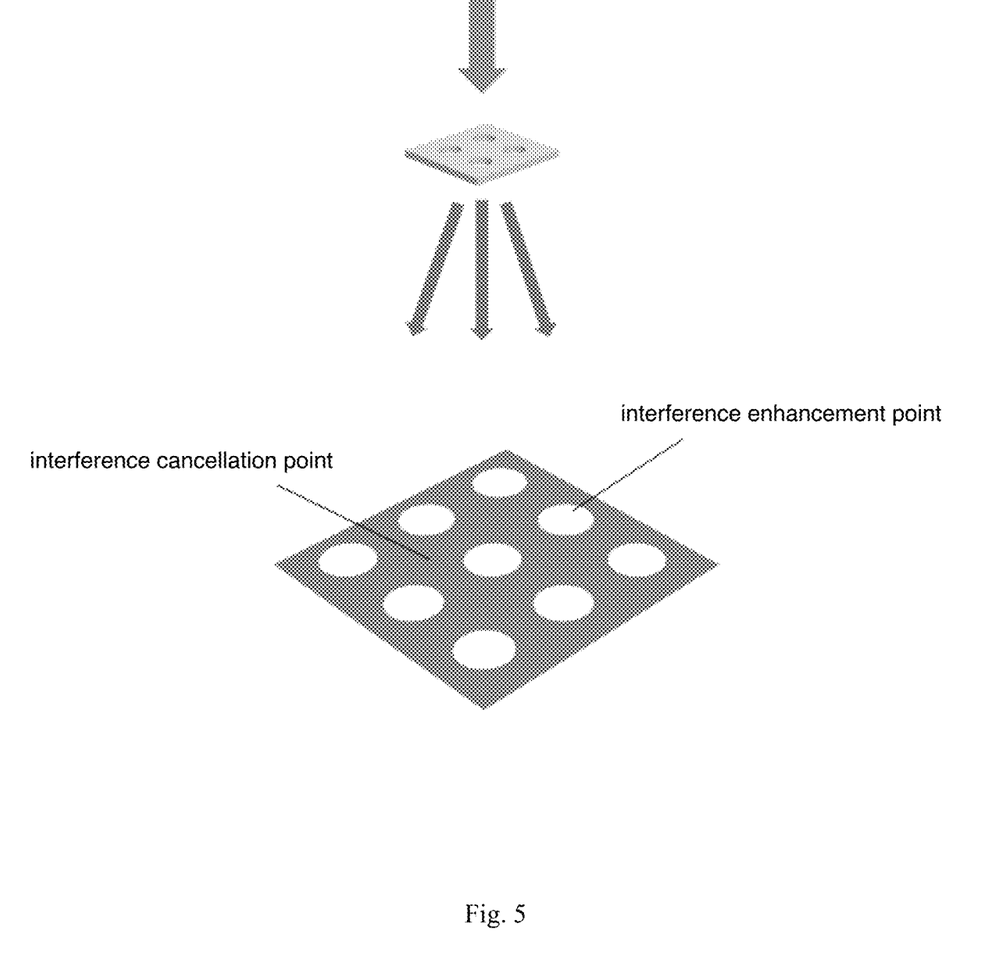
FIG. 5 is a sketch view of a laser beam passing through apertures and an interference pattern thereof.
Figure 6:
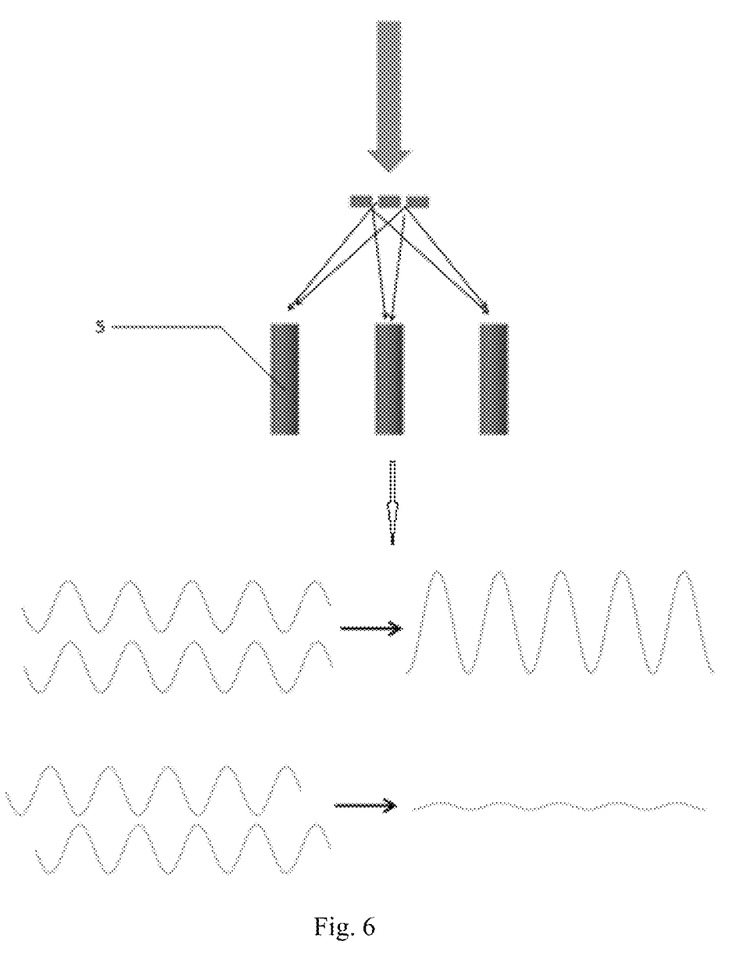
FIG. 6 illustrates a principle of depositing few-layer $PtSe_2$ on a silicon nano-array structure through laser interference enhanced induction chemical vapor deposition according to the present invention.

Referring to FIGS. 5 and 6, a principle for using the laser interference enhanced induction chemical vapor deposition to deposit the few-layer PtSe$_2$ on the silicon nano-array structure is: when a laser beam passes through the regular-quadrilateral distributed apertures, according to the Fresnel principle, a new spherical wave will be formed each time when the laser beam passes through an aperture, so as to obtain multiple coherent laser beams with same frequency and light vector direction. Optical path differences will be generated when these coherent lights meet at different spatial positions. If the optical path difference is an integer multiple of the wavelength, the light intensity will be coherently enhanced; and if the optical path difference is an odd multiple of the half-wavelength, the light intensity will be coherently weakened. Different lattice-like array-distributed interference patterns can be obtained on the nano-array structure by changing the diameter of the apertures, the hole spacing of the apertures, and the distance between the apertures and the silicon nanopillar array structure. The pattern distribution can be adjusted so that the interference enhancement points are located on silicon nanopillars, and the interference cancellation points are located at the gaps between the silicon nanopillars. The Pt-containing gaseous compounds can absorb enough energy at the laser interference enhancement points, wherein Pt is reduced by hydrogen mixed in the transportation gas, and then chemically reacts with selenium. The generated $PtSe_2$ is deposited on the surface of the silicon nano-array structure to form a film, so that the few-layer $PtSe_2$ completely covers the surfaces of the silicon nanopillars including the sidewalls of the silicon nanopillars.

The above embodiments are only two typical implementations of the photodetector based on the graphene and the nanopillar array structure as described in the present invention. However, implementing of the present invention are not limited by the embodiments. Changes, modifications, substitutions, combinations, and simplifications that deviate from the spirit and principle of the present invention should be equivalent replacement methods, and are all included in the protection scope of the present invention.

What is claimed is:

1. A photodetector based on $PtSe_2$ and a silicon nanopillar array, comprising: a polymethyl methacrylate PMMA light-transmitting protective layer, a graphene transparent top electrode, and a silicon nanopillar array structure covered with few-layer $PtSe_2$, which are arranged in sequence from top to bottom; wherein metal electrodes are provided on a back side of the silicon nanopillar array structure as well as on a periphery of an area uncovered by the silicon nanopillar array structure covered with the few-layer $PtSe_2$ on a back side of the graphene transparent top electrode; the polymethyl methacrylate PMMA light-transmitting protective layer is spin-coated on a front side of the graphene transparent top electrode; the back side of the graphene transparent top electrode is in direct contact with the few-layer $PtSe_2$ to collect photo-generated carriers; the silicon nanopillar array structure consists of an upper part and a lower part; the upper part is a periodically arranged dense silicon nanopillar array structure, and the lower part is an unetched silicon substrate; the silicon nanopillar array structure is perpendicular to the silicon substrate.

2. The photodetector, as recited in claim 1, wherein a surface of the silicon nanopillar array structure is completely covered by the few-layer $PtSe_2$ through laser interference enhanced induction vapor deposition, wherein top ends and sidewalls of silicon nanopillars are all covered by the few-layer $PtSe_2$ with uniform thicknesses.

3. The photodetector, as recited in claim 1, wherein the graphene transparent top electrode is combined with the few-layer $PtSe_2$ through a van der Waals force to form an ohmic contact; the $PtSe_2$ is a P-type semiconductor, and after the $PtSe_2$ contacts with N-type silicon, due to a concentration difference between electrons and holes, carriers diffuse and form a space charge depletion zone at an interface, which generates a built-in electric field; a diffusing direction of the carriers is opposite to a drift direction generated by the built-in electric field, and concentrations finally reach a thermal equilibrium; the photo-generated carriers are then separated by the built-in electric field, and are led to an external circuit by the graphene transparent top electrode and the metal electrodes on the back side thereof, as well as by the silicon nanopillar array structure and the metal electrodes on the back side thereof, so as to generate electrical signals.

4. The photodetector, as recited in claim 1, wherein the photodetector adopts a forward incident mode; an incident direction of an incident light is from the polymethyl methacrylate PMMA light-transmitting protective layer, through the graphene transparent top electrode, and then to the silicon nanopillar array structure coated with the few-layer $PtSe_2$.

5. A method for preparing a photodetector, comprising steps of:
1) preparing graphene as a graphene transparent top electrode;
2) preparing a silicon nanopillar array structure;
3) coating few-layer $PtSe_2$ on a surface of the silicon nanopillar array structure;
4) spin-coating PMMA on a front side of the graphene transparent top electrode to form a polymethyl methacrylate PMMA light-transmitting protective layer, and transferring to the silicon nanopillar array structure covered with the few-layer $PtSe_2$; and
5) preparing metal electrodes on a back side of the graphene transparent top electrode as well as on a back side of the silicon nanopillar array structure.

6. The method, as recited in claim 5, wherein in the step 1), the graphene is prepared on a surface of a copper foil through chemical vapor deposition; ethanol and methane are used as raw materials; the prepared graphene has 1-3 layers; in the step 2), a periodically arranged monocrystalline silicon pillar array structure is obtained through photolithography and dry etching processing.

7. The method, as recited in claim 5, wherein in the step 3), Pt-containing compounds and Se are heated to evaporate, and are transported to the surface of the silicon nanopillar array structure in a reaction chamber by an inert gas mixed with a preset ratio of hydrogen; through laser interference enhanced induction vapor deposition, the Pt-containing compounds, Se and hydrogen are induced by laser irradiation to undergo a chemical reaction; generated $PtSe_2$ is deposited on the surface of the silicon nanopillar array structure to form a few-layer $PtSe_2$ film.

8. The method, as recited in claim 7, wherein when depositing the few-layer $PtSe_2$, a laser beam is divided into multiple coherent beams through regular-quadrilateral distributed apertures, which forms a regular-quadrilateral distributed interference light field in an area where the silicon nanopillar array structure is located; an optical path difference is adjustable by changing a diameter of the apertures, a hole spacing of the apertures, and a distance between the apertures and the silicon nanopillar array structure, so that interference enhancement points of a coherent pattern on the silicon nanopillar array structure are located on silicon nanopillars, and interference cancellation points are located at gaps between the silicon nanopillars.

9. The method, as recited in claim 5, wherein in the step 4), a wet transfer technology is adopted to transfer the graphene transparent top electrode to the silicon nanopillar array structure which is coated with the few-layer $PtSe_2$ without removing the PMMA.

10. The method, as recited in claim 5, wherein in the step 5), the prepared photodetector is processed with one-step magnetron sputtering to obtain the metal electrodes on the back side of the graphene transparent top electrode as well as on the back side of the silicon nanopillar array structure; the silicon nanopillar array structure covered with the few-layer $PtSe_2$ occupies most area in a middle of the graphene transparent top electrode and acts as a mask; during metal electrode sputtering, the electrodes are deposited on the back side of the silicon nanopillar array structure as well as on a periphery of an area uncovered by the silicon nanopillar array structure on the graphene transparent top electrode, thereby forming two metal electrodes synchronically through the one-step magnetron sputtering.

\* \* \* \* \*